United States Patent [19]
Plumton et al.

[11] Patent Number: 5,910,665
[45] Date of Patent: Jun. 8, 1999

[54] LOW CAPACITANCE POWER VFET METHOD AND DEVICE

[75] Inventors: Donald Lynn Plumton, Dallas; Jau-Yuann Yang, Richardson, both of Tex.

[73] Assignee: Texas Instruments Incorporated, Dallas, Tex.

[21] Appl. No.: 08/768,357

[22] Filed: Dec. 17, 1996

Related U.S. Application Data

[60] Provisional application No. 60/009,317, Dec. 29, 1995.
[51] Int. Cl.$^6$ .......... H01L 29/80; H01L 31/112; H01L 29/76; H01L 29/94
[52] U.S. Cl. .......... 257/284; 257/330; 257/331
[58] Field of Search .......... 257/330, 331, 257/332, 254, 285, 287

[56] References Cited

U.S. PATENT DOCUMENTS

| | | |
|---|---|---|
| 4,115,793 | 9/1978 | Nishizawa . |
| 4,129,879 | 12/1978 | Tantraport et al. .......... 357/22 |
| 4,636,823 | 1/1987 | Margalit et al. .......... 357/23.3 |
| 4,903,089 | 2/1990 | Hollis et al. .......... 357/22 |
| 5,106,778 | 4/1992 | Hollis et al. .......... 437/90 |
| 5,231,037 | 7/1993 | Yuan et al. .......... 437/40 |
| 5,342,795 | 8/1994 | Yuan et al. .......... 437/40 |

FOREIGN PATENT DOCUMENTS

| | | |
|---|---|---|
| 0 145 567 | 6/1985 | European Pat. Off. . |
| 2 129 992 | 11/1972 | France . |
| 1 470 014 | 4/1977 | United Kingdom . |
| 2 000 908 | 1/1979 | United Kingdom . |

OTHER PUBLICATIONS

*IEEE Electron Device Letters*, vol. 16, No. 4, "A Low On–Resistance, High–Current GaAs Power VFET", Apr. 1995, 2 pgs.
"150 Volt Vertical Channel GaAs FET", Campbell et al., International Electron Devices Meeting. Technical Digest, Dec. 1982, *IEEE USA*, pp. 258–260, (p. 258 col. 2; figure 1).
"High–voltage two dimensional simulations of permeable base transistors", Alley, G.D., *IEEE Transactions on Electron Devices*, vol. Ed–30, NR. 1, Jan. 1983, USA, pp. 52–60, p. 52, col. 1, paragraph 1, figure 1.

*Primary Examiner*—Stephen D. Meier
*Attorney, Agent, or Firm*—Bret J. Petersen; Richard L. Donaldson

[57] ABSTRACT

A method and structure for a vertical FET transistor device (VFET) is described for a lower junction capacitance VFET to decrease the switching power loss and achieve increased current capacity and/or deceased thermal dissipation. In a preferred embodiment, the gate capacitance is reduced over prior art methods and structures by etching to the gate 14 and directly contacting the p+ gate with a p-ohmic contact 24. In another embodiment, the area under the gate contact 22 is implanted with a "trim" dopant, where the trim dopant acts to reduce the doping of the drainlayer thereby reducing the capacitance. In another embodiment, the area under the exposed gate contact 22 is isolated by ion damaged to reduce the doping/conductivity of the n– drain layer below a portion of the gate layer to reduce the gate-to-drain capacitance.

19 Claims, 3 Drawing Sheets

LOW CAPACITANCE POWER VFET METHOD AND DEVICE

This application claims the benefit of provisional application 60/009,317 filed Dec. 29, 1995.

FIELD OF THE INVENTION

This invention generally relates to high frequency semiconductor devices, and more particularly to the fabrication of vertical-channel field-effect transistor (VFET) devices suitable for high power, high frequency applications.

CROSS-REFERENCE TO RELATED APPLICATIONS

The following coassigned patent applications are incorporated herein by reference:

| Number | Filing Date | Title |
| --- | --- | --- |
| 5,231,037 | 04/30/92 | Method of Making a Power VFET Device Using a P+ Carbon Doped Gate Layer |
| 5,342,795 | 11/15/93 | Method of fabricating Power VFET Gate-Refill |

BACKGROUND OF THE INVENTION

Without limiting the scope of the invention, its background is described in connection with power FET devices, as an example.

In the field of highly integrated electronics, previous power distribution practices and power supply technologies were not adequate to supply well regulated power to using circuitry. The concept of centralized power with decoupled loads simply has not worked well. The power distribution problem is moving from standard design techniques to real point-of-use regulators in the form of high-efficiency switching power supplies. Such power supplies are typically and more efficient than previous power supplies.

GaAs VFETs are attractive for high-efficiency switching power supplies. Several studies have concluded that the intrinsic devices have a factor of 5 to 8 lower on-resistance per unit area, as compared to state-of-the-art DMOS or UMOS power devices fabricated by the most advanced processes available. In addition, GaAs VFETs have excellent switching speed. Therefore, with such a device, the efficiency of switching power supplies can be significantly improved.

Previously filed applications, U.S. Pat. No. 5,231,037 filed Apr. 30, 1992 and U.S. Pat. No. 5,342,795 filed Nov. 15, 1993, both by Yuan et al., introduced VFETs using carbon as a low diffusion, high concentration p-type gate dopant. These VFETs increased the potential uses of GaAs Power VFETs. Specifically, buried carbon gate electrodes may be used to design VFETs with channel openings less than 1.0 $\mu$m. Meanwhile, the high doping concentration ($\approx 10^{20}$ cm$^{-3}$) can make the gate sheet resistance acceptable for converter type (>1 MHz switching) rectifier applications. In comparison to the most advanced UMOS power transistors previously reported, the GaAs VFET using the carbon gate electrodes is superior in the four categories that are important to the design of a low-loss, high-efficiency switching power supply: on-resistance, junction capacitance, gate resistance, and gate driving voltage. Furthermore, the new GaAs VFETs can be switched in less than 2 ns, while the UMOS power devices generally require at least 50 ns to switch because of much higher gate resistance. The GaAs VFETs fabricated using the carbon doped gate can also be used for other applications such as high-power microwave amplifiers and high-gain photodetectors.

SUMMARY OF THE INVENTION

In an effort to improve the usefulness of the VFET design, the present invention is particularly directed toward lowering junction capacitance over prior art designs. Lowering the capacitance of the VFET device will decrease the switching power loss of the device thereby allowing for increased current capacity and/or decreased thermal dissipation required for the device. In a preferred embodiment, the gate capacitance is reduced over prior art methods and structures by etching to the gate and directly contacting the p+ gate with a p-ohmic contact.

In another embodiment, the area under the gate layer is implanted with a "trim" dopant, where the trim dopant acts to reduce the doping of the n– channel and n– GaAs drainlayer under the gate metal contact and create a gate isolation region below the gate contact. Preferably, the energy of the implant is chosen to implant through the p+ gate leaving only the tail of the implant in the p+ gate. Since the dopant of the p+ gate is several orders of magnitude greater than the trim doping, the gate will not be significantly affected.

In an additional preferred embodiment, the area under the exposed gate layer which is under the gate metal contact is isolated by ion damage to reduce the conductivity of the n– drain layer below a portion of the gate layer to reduce the gate-to-drain capacitance. Since the p+ gate is not easily damaged the gate will not be significantly affected. The isolation is preferably done with boron ion or hydrogen ion damage with the implant energy to maximize damage below the p+ gate.

Generally, and in one form of the invention, a method is presented for fabricating a VFET, while minimizing the device capacitance problems. Since the drain and source in the VFET can be inverted, they are referred to as drain/source. The method comprises: forming a n-type first drain/source layer; forming a p-type gate layer on the drain/source and patterning a gate structure; and forming a n-type second drain/source layer over the gate layer and the channel; etching to the gate structure; implanting a trim layer beneath a portion of the gate structure; forming p-ohmic contact to the gate structure; forming n-ohmic source contact; and forming n-ohmic drain contact. Preferably, the first drain/source layer is formed on a n+ substrate; a n+ cap layer is formed over the second drain/source layer; the gate layer, and the second drain/source layer are GaAs and are epitaxially formed. The implanted p+ dopant may be Be or Mg; the gate contact may be AuZn or TiPtAu; the trim dopant may be Be or Mg and the n-ohmic contact may be AuGeNi.

An advantage of the present invention is the overall capacitance of the gate can be reduced. This is advantageous because lowering the capacitance can improve the switching power loss. This is particularly important for higher frequency switching devices where the switching power loss can dominate the conduction power loss, since the power loss is directly proportional to frequency times the capacitance.

An additional advantage of the present invention is a reduced area needed for the gate contact over prior art designs. A further advantage is a lower gate resistance from the direct contact gate over the implant contact.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

Corresponding numerals and symbols in the different figures refer to corresponding parts unless otherwise indicated.

DETAILED DESCRIPTION

The present invention discloses advantages and improvements over prior art structures. Previous structures and methods for GaAs power VFETs have had excessive gate-to-source and gate-to-drain capacitance. By decreasing the gate capacitance according to the present invention the overall capacitance of the gate can be reduced. This is advantageous because lowering the capacitance can improve the switching power loss. This is particularly important for higher frequency switching devices where the switching power loss can dominate the conduction power loss, since the power loss is directly proportional to frequency times the capacitance. For example power loss can be represented by:

$$Powerless = I^2R + CV^2f$$

where,

I=source-drain current
R=source-drain resistance
C=total capacitance
V=voltage
f=operating frequency.

Figure 1:
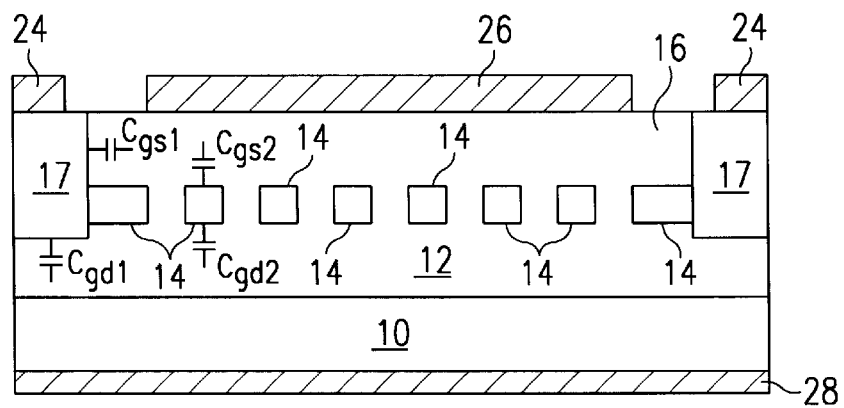
FIG. 1 shows a cross-sectional view of a prior art structure.

A VFET gate structure according to the prior art, such as disclosed in the patents listed above, is represented in FIG. 1. In these typical prior art structures, an n-type epitaxial drain layer 12 is formed over a n+ substrate 10. A p+ epitaxial gate layer 14 is formed over the drain layer 12 and etched to define the gate structures 14, or the gates may be formed in etched channels to produce the gate structure shown in FIG. 1. The n-type epitaxial source layer 16 is formed over the gate structures 14. Contact to the gates 14 is made with a P+ implant 17 and a P ohmic contact 24. The gate to source capacitance can be represented by the capacitors shown in FIG. 1 as $C_{gs1}$ and $C_{gs2}$. The gate to drain capacitance can be represented by the capacitors shown in FIG. 1 as $C_{gd1}$ and $C_{dg2}$.

The methods and structure of the present invention are directed to substantially lowering or eliminating $C_{gs1}$ and $C_{gd1}$. The etch to gate concept described below effectively eliminates $C_{gs1}$ by separating the gate contact from direct exposure to the source layer. Capacitance $C_{gd1}$ is reduced because of the reduced width of the gate contact compared to the prior art P+ implant 17 needed to contact the gate. Also, $C_{gd1}$ is reduced because the P+ implant no longer is in close contact to the N+ drain layer. As described below, $C_{gd1}$ can be further reduced by trimming the dopant of the N– layer or by damaging this layer in the region of the gate contact. These methods make the region near the gate more insulative to reduce the capacitance.

Figure 2:
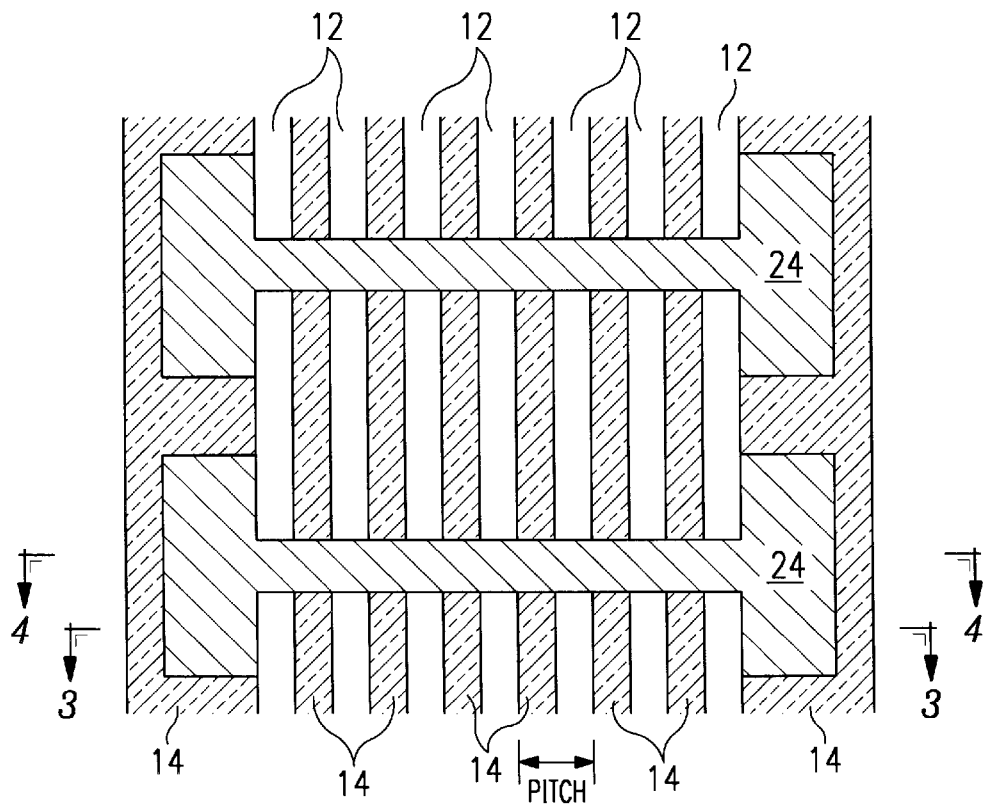
FIG. 2 shows a cross-sectional top view of the gate contact and gate layer of an embodiment of this invention.

A cross-sectional top view of a portion of a preferred device structure is shown in FIG. 2. The device structure may be repeated to form a larger area device for higher current capability as disclosed by D. L. Plumton et al., A Low On-Resistance, High-Current GaAs Power VFET, IEEE Electron Device Lttrs, Vol. 16,No. 4, pp. 142–144, 1995. The gate contact 24 is shown above the gate structure 14. A cross-sectional line A—A indicates where cross-sections for FIGS. 3a–f are taken.

Figure 3A:
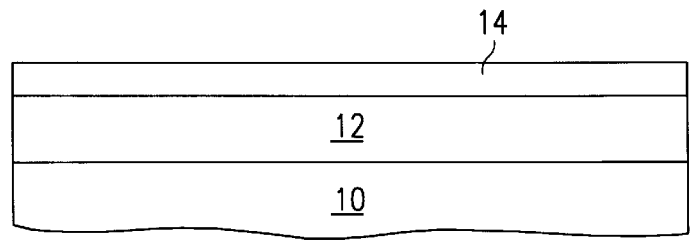
FIG. 3a–3f show cross-sectional views, at different processing stages, of a method of forming contacts for embodiments of the present invention.
Figure 3B:
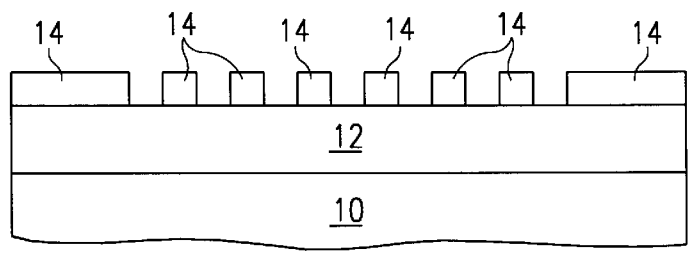

FIGS. 3a–3f show sequential steps of a first embodiment process to fabricate the device of the present invention. As shown in FIG. 3a, a n-type epitaxial drain (or source or first drain/source) layer 12 is formed over a preferably n+ substrate 10. The thickness and dopant level of the drain layer 12 is dependent on the specific device design. However, the dopant level is generally considered n to n–. A p+ epitaxial gate layer 14 is then formed over the drain layer 12. The gate layer 14 is preferably heavily doped, with carbon, at a concentration of preferably $\approx 10^{20}$ cm$^{-3}$ or higher, but may be doped at a lower concentration such as $10^{18}$ cm$^{-3}$. Generally, the higher the dopant concentration the faster the switching because of the lower the gate resistance. The gate layer 14 is preferably about 250–500 nm thick or thicker to reduce gate resistance. The gate layer 14 is then etched to define the gate structures 14, shown in FIG. 3b. Due to the near zero diffusion of carbon, the gate electrodes 14 may preferably be $\approx 1$ μm pitch, where pitch is the distance from a first gate edge to the next gate edge as shown in FIG. 2. The resultant device will have a low-resistive, buried-gate structure with a channel opening of only 0.5 μm.

Figure 3C:
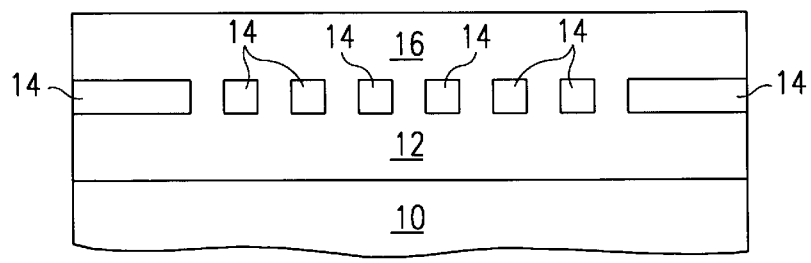
Figure 3D:
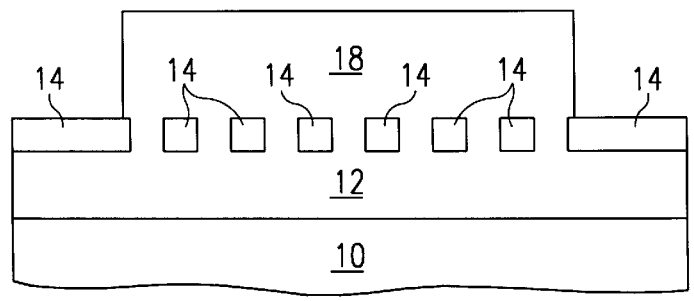

In FIG. 3c, a n-type epitaxial source (or drain or second drain/source) layer 16 is formed over the gate structures 14. The dopant concentration and thickness of the source layer 16, like the drain layer 12, is dependent on the specific device application. The n-type epitaxial source layer 16 is etched to form source mesa 18 and etch to the gate layer 14 as shown in FIG. 3d. The etch to the gate is done in the area where the gate contact is to be made while the remainder of the gate layer is preferably not exposed. After opening the source layer to the gates, the source layer is preferably masked with a suitable masking material 20.

Figure 3E:
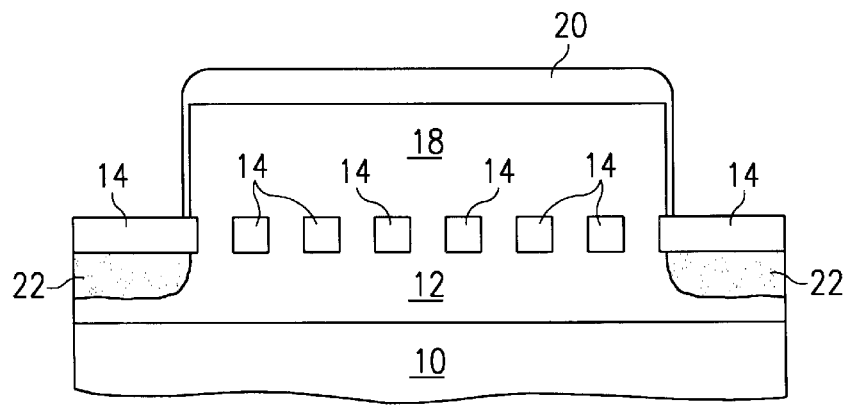

In the most preferred embodiments, the area under the gate contact is isolated from the gate to reduce the overall capacitance. In a first embodiment, the isolation area under the exposed gate layer 14 is implanted with a "trim" dopant 22 as shown in FIG. 3e. The trim dopant creates a gate isolation region which acts to reduce the doping under the gate contact thereby reducing the capacitance of the device. For example, a p dopant at 1e$^{16}$ could be implanted to a n– drain layer of 3e$^{16}$ to reduce the effective n– layer to 2e$^{16}$ (counter doping). Preferably, the energy of the implant is chosen to implant through the p+ gate 14 leaving only the tail of the implant in the p+ gate. Since the dopant of the p+ gate is several orders of magnitude greater than the trim doping, the gate will not be significantly affected. The trim dopant is preferably Be and is preferably activated by annealing for approximately 30 seconds at about 600–700° C. subsequent to implantation.

In a second preferred embodiment, the area under the exposed gate layer 14 is damaged to reduce the conductivity of the N– drain layer in this area in order to reduce the gate-to-drain capacitance. Preferably, the energy of the implant is chosen to damage an area about 0.5 µm below the p+ gate 14. Since the p+ gate is not easily damaged the gate will not be significantly affected. The isolation is preferably done with boron ion or hydrogen ion damage with the implant energy to maximize damage below the p+ gate 14.

Figure 3F:
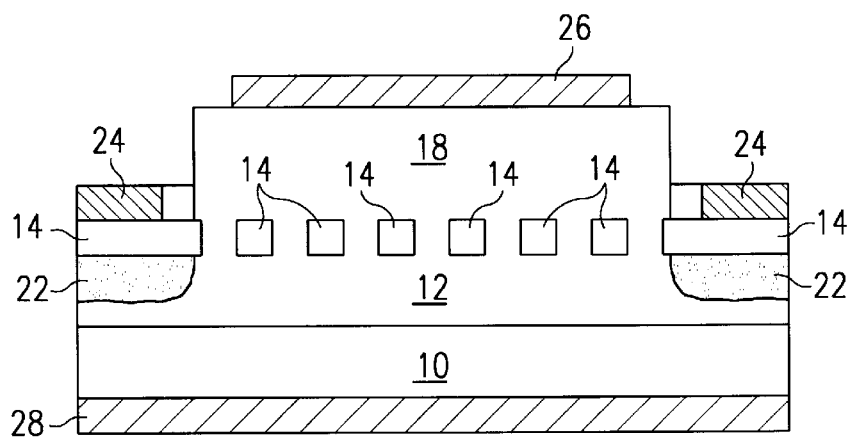
Figure 4:
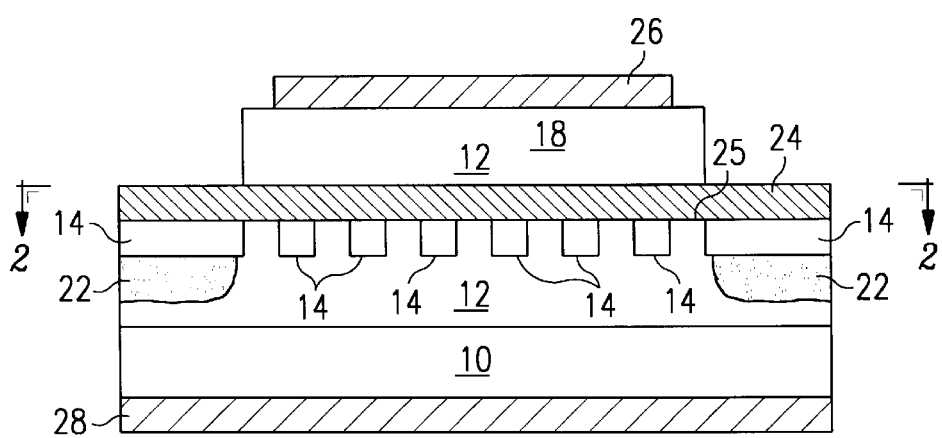
FIG. 4 shows another cross-sectional view of an embodiment of this invention.

As shown in FIG. 3f, contact 24 to the gate 14 is formed preferably after the area below the gate layer is trimmed or damaged as discussed above. The contact 24 may be formed of any suitable metal. There is one potential problem with this etch to gate approach using a p-ohmic metal contact to the gate. If the p-ohmic metal 24 sitting on the n-channel 12, illustrated in FIG. 4 at 25, makes too good a contact it may result in a low breakdown area. To avoid this problem, a Schottky material as the gate contact 24 could be used. For example, a Schottky material such as TiPtAu for a contact 24 on the P+C:GaAs gate layer 14 will make a good ohmic contact while the TiPtAu contact 24 on the n-GaAs channel 12 will be a Schottky. Since the Schottky diode created at this junction 25 is reversed biased, there is no voltage breakdown of the gate 24 to the n-channel 12.

A n+ cap layer (not shown) may optionally be formed over the source layer 16 prior to forming the n-ohmic metal contact 26 to improve ohmic contact. A n++ InGaAs layer may also be added for improved contact resistance. Examples of contact material include AuGeNi, PdGe, InGaAs with TiPtAu or WSi. The substrate 10 may then be thinned and metal contact 28 to the substrate 10 may be formed on the backside of the wafer. The choice of drain 12 and source 16 designations may be switched if desired.

Several embodiments have been described in detail hereinabove. It is to be understood that the scope of the invention also comprehends embodiments different from those described, yet within the scope of the claims. For example, the n type dopant, while preferably silicon, could be a material such as S, or Se. Similarly, the GaAs could be replaced with a material such as InGaAs, InP, or GaInP. Alternately, a combination of GaAs as the source and gate layers with alternative drain materials such as InGaAs, InP, or GaInP could be used. Words of inclusion are to be interpreted as nonexhaustive in considering the scope of the invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

TABLE 1

| Drawing Element | Preferred or Specific Examples | Generic Term | Other Alternate Examples |
|---|---|---|---|
| 10 | GaAs | Substrate | |
| 12 | n-type | Drain or Source Layer | |
| 14 | GaAs LED | Gate Layer and Gate Structures | |
| 16 | n-type | Drain or Source Layer | |
| 17 | P+ Implant | Gate Contact (Prior Art) | |
| 18 | | Source Mesa | |
| 20 | | Resist | |

TABLE 1-continued

| Drawing Element | Preferred or Specific Examples | Generic Term | Other Alternate Examples |
|---|---|---|---|
| 22 | Trim Layer | Isolation Area | Boron Ion Damage, Hydrogen Ion Damage or Counterdoped Region |
| 24, 25 | P-ohmic Contact | Gate Contact | TiPtAu (Schottky Contact to source/drain and ohmic contact to the highly doped gate layer) |
| 26 | N-Ohmic | Source Contact | |
| 28 | N-Ohmic | Drain Contact | |

The GaAs VFETs fabricated by the process of the present invention will not only be superior for high-frequency switching power supplies, but also for other applications such as high-power microwave amplifiers and high-gain photodetectors. Table 1 may be referred to for clarification of the element numbers in the drawings. For the sake of clarity certain layers are referred to as either source or drain layers, however, if desired these layers may be interchanged. Furthermore, a more generic term such as first and second source/drain layers may also be used.

What is claimed is:

1. A microelectronic structure comprising:
   a. a n-type layer over a substrate;
   b. a p-type carbon doped gate grid structure in said n-type layer which form channels between a source and a drain portion of said n-type layer;
   c. a gate contact to said gate structure;
   d. a more electrically insulative region of said n-type layer which forms a gate isolation region in said n-type layer below said gate contact to said gate structure;
   e. a source contact to said source; and
   f. a drain contact to said drain.

2. The structure of claim 1, wherein said gate contact to said gate grid structure is of a metal having Schottky effects with said n-type layer in said channels.

3. The structure of claim 1, wherein said gate isolation region in said n-type layer further comprises a trim doping, wherein said trim dopant is a counter doping to reduce the doping level of the n-type layer in said isolation region to be more insulative.

4. The structure of claim 3, wherein said trim doping is Be.

5. The structure of claim 1, further wherein said gate isolation region in said first n-type layer is an ion damaged area.

6. The structure of claim 5, wherein said ion damaged area is B damaged.

7. The structure of claim 5, wherein said ion damaged area is H damaged.

8. The structure of claim 1, wherein a n+ cap layer is formed over said second drain/source layer.

9. The structure of claim 1, wherein said gate contact is AuZn.

10. A microelectronic structure comprising:
    a. an n-type first drain/source layer over a substrate;
    b. a p-type carbon doped gate structure in said n-type first drain/source layer;
    c. a n-type second drain/source layer over said gate structure;
    d. a p-ohmic metal gate contact to said gate structure; and
    e. a more electrically insulative region of said n-type layer which forms a gate isolation region in said first source/ drain layer below said p-ohmic metal contact to said gate structure.

11. The structure of claim 10, wherein said gate contact to said gate structure is of a metal having Schottky effects with said n-type layer in said channels.

12. The structure of claim 11, wherein said metal to form said gate contact is TiPtAu.

13. The structure of claim 10, wherein said gate isolation region in said first drain/source layer further comprises a trim doping, wherein said trim dopant is a counter doping to reduce the doping level of the n-type layer in said isolation region to be more insulative.

14. The structure of claim 12, wherein said trim doping is Be.

15. The structure of claim 10, further wherein said gate isolation region in said first drain/source layer is an ion damaged area.

16. The structure of claim 14, wherein said ion damaged area is B damaged.

17. The structure of claim 14, wherein said ion damaged area is H damaged.

18. The structure of claim 10, wherein a cap layer is formed over said-second drain/source layer.

19. The structure of claim 10, wherein said first drain/source layer, said gate structure, and said second drain/source layer are GaAs.

* * * * *